United States Patent [19]

Chen et al.

[11] Patent Number: 4,948,893

[45] Date of Patent: Aug. 14, 1990

[54] NOVEL BENZOFURAN DYES

[75] Inventors: Chin H. Chen, Fairport, N.Y.; John L. Fox, Baltimore, Md.

[73] Assignee: Eastman Kodak Company, Rochester, N.Y.

[21] Appl. No.: 394,893

[22] Filed: Aug. 17, 1989

Related U.S. Application Data

[62] Division of Ser. No. 191,948, May 9, 1988, Pat. No. 4,900,831.

[51] Int. Cl.$^5$ ............................................. C07D 491/06
[52] U.S. Cl. ....................................... 546/66; 430/281
[58] Field of Search ............................................. 546/66

[56] References Cited

U.S. PATENT DOCUMENTS

| | | | |
|---|---|---|---|
| 3,873,940 | 3/1975 | Drexhage | 546/66 |
| 3,932,446 | 1/1976 | Grychtol | 260/309 |
| 4,260,776 | 4/1981 | Harnisch | 546/66 |
| 4,278,751 | 7/1981 | Specht et al. | 430/281 |
| 4,736,032 | 4/1988 | Fox et al. | 546/66 |
| 4,743,528 | 5/1988 | Farid et al. | 430/281 |
| 4,743,529 | 5/1988 | Farid et al. | 430/281 |
| 4,743,530 | 5/1988 | Farid et al. | 430/281 |
| 4,743,531 | 5/1988 | Farid et al. | 430/281 |

FOREIGN PATENT DOCUMENTS 3322946 1/1985 Fed. Rep. of Germany ........ 546/66

OTHER PUBLICATIONS

Soo et al, "Sur, Quelg, Prop. Formyl–2–Benzofuran", Bull. Soc. Chim. France, pp. 1875–1877 (1962).

*Primary Examiner*—Mukund J. Shah
*Assistant Examiner*—Andrew G. Rozycki
*Attorney, Agent, or Firm*—Carl O. Thomas

[57] ABSTRACT

A 6-tertiary amino-2-(Z=CH—)benzofuran dye is disclosed, where Z represents the atoms providing an electron withdrawing group and a conjugated methine linkage completing a resonant dye chromophore including the 6-tertiary amino group as an electron donor and the electron withdrawing group as an electron acceptor. The dyes are formed by condensing a 6-tertiary amino-2-formylbenzofuran with an electron withdrawing dye nucleus precursor containing an active methyl or methylene site. The dyes exhibit bathochromically shifted absorption peaks.

5 Claims, No Drawings

NOVEL BENZOFURAN DYES

This is a divisional of application Ser. No. 191,948, filed May 9, 1988, now Pat. No. 4,900,831.

FIELD OF THE INVENTION

The invention relates to certain novel dyes. More specifically, the invention relates to benzofuran dyes containing novel chromophores.

PRIOR ART

Grychtol U.S. Pat. No. 3,932,446 discloses a 6-aminobenzofuran dye which is substituted in its 2 position with a cyano group, a carboxy acid or ester group, or a electron donating nucleus, such as a benzoxazole, benzothiazole, or benzimidazole.

Specht et al U.S. Pat. No. 4,278,751 discloses a ketocoumarin coinitiator for free radical polymerization having a maximum absorption in the 350 to 550 nm range containing a 7-amino substituent to the coumarin ring. The 7-amino substituent can complete a julolidene ring fused with the coumarin ring.

RELATED PATENT APPLICATIONS

Farid et al U.S. Ser. Nos. 933,712, 933,658, 933,660, and 933,657, all filed Nov. 21, 1986, now issued as U.S. Pat. Nos. 4,743,528, '529, '530, and '531, and commonly assigned, disclose hardenable compositions comprised of an organic compound containing ethylenic unsaturation, an azinium salt activator, and, acting as a photosensitizer, a dye having a reduction potential which is at most 0.1 more positive than the reduction potential of the azinium salt activator.

Chen et al U.S. Pat. No. 4,736,032 discloses imaging systems containing certain of the dyes of this invention employed as photosensitizers.

SUMMARY OF THE INVENTION

In one aspect, this invention is directed to a 6-tertiary amino-2-(Z=CH—)benzofuran, where Z represents the atoms providing an electron withdrawing group and a conjugated methine linkage completing a resonant dye chromophore including the 6-tertiary amino group as an electron donor and the electron withdrawing group as an electron acceptor.

The present invention has as its purpose to provide a 6-tertiary aminobenzofuran dye containing a novel chromophore. Specifically, the dyes of the present invention contain a resonant dye chromophore which links the electron donating 6-amino substituent with an electron accepting second nucleus chosen from any of a variety of known electron accepting nuclei. As a result, the invention makes possible 6 -tertiary aminobenzofuran dyes having longer wavelength absorption peaks and properties better suited to a variety of applications. Both fluorescent dyes and dyes capable of acting as coinitiators for free radical polymerization are within the contemplation of this invention.

DESCRIPTION OF PREFERRED EMBODIMENTS

This invention is directed to a 6-tertiary aminobenzofuran dye containing a novel chromophore produced by providing at the 2 position of the furan ring a substituent satisfying the formula:

where
Z represents the atoms providing an electron withdrawing group and a conjugated methine linkage completing a resonant dye chromophore including the 6-tertiary amino group as an electron donor and the electron withdrawing group as an electron acceptor.

The dyes of the present invention contain a resonant chromophore which can be represented by the resonance extremes:

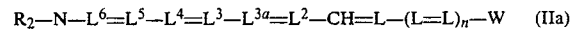

and

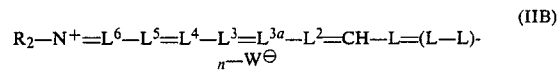

where
$R_2$ represent any convenient choice of substituents to complete a tertiary amine;
$L^2$, $L^3$, $L^{3a}$, $L^4$, $L^5$, and $L^6$ represent methine groups provided by the benzofuran nucleus, where the superscript corresponds the ring site at which the methine group is located;
$=L-(L=L)_n-W$ corresponds to Z;
L is independently in each occurrence an optionally substituted methine group;
n is zero or a positive integer, typically 4 or less; and
W is an electron acceptor.

In keeping with established practice, the various forms of dye structures are named by reference to the uncharged resonance extreme represented by Formula IIa.

The dyes of the present invention can be prepared by employing a 6-tertiary amino-2-formyl-benzofuran as a starting material. The 6-tertiary amino-2-formylbenzofuran can be condensed with a precursor of Z at an active methyl or methylene site. In other words, the novel chromophore can be formed by the reaction:

where
6TABF—CHO represents a 2-formyl-6-(tertiary amino)benzofuran and
$H_2Z'$ is an active methyl or methylene precursor of Z.

From the simplicity of the condensation reaction it is apparent that Z can take a wide range of forms and permitting both the chromophore and the physical properties of the dye to be tailored to specific application requirements.

The description which follows is directed to certain preferred, illustrative forms of the dyes. The terms "alkyl" and "aryl" are employed throughout to indicate substituents that can be widely varied. In general it is preferred to choose alkyl substituents from among those that contain 1 to 8 carbon atoms. Aryl substituents preferably contain from 6 to 10 carbon atoms—e.g., phenyl or naphthyl. To minimize molecular bulk lower alkyl groups (those containing from 1 to 3 carbon atoms—i.e., methyl, ethyl, and propyl) and phenyl groups are optimum substituent choices satisfying the alkyl and aryl substituent definitions, respectively.

In a preferred form 2-(6-tertiary-amino)benzofuranyl nucleus of the dye can be represented by the following formula:

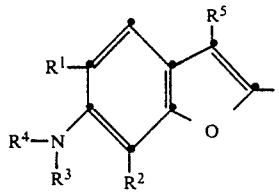

where

R¹, R², and R⁵ each independently represent hydrogen, alkyl, or aryl and

R³ and R⁴ each independently represent alkyl; or at least one of the substituent pairs represented by R¹ and R⁴, R² and R³, and R³ and R⁴ complete a 5- or 6-membered ring.

For example, R¹ and R², when independent of the amino group, and R⁵ are preferably hydrogen, but substituent variations, such as, phenyl, methyl, ethyl, propyl, and the like are readily accommodated on the ring structure. R³ and R⁴, when present as independent substituents, are preferably alkyl, such as methyl or ethyl. R³ and R⁴ can together form any convenient 5- or 6-membered ring structure, such as morpholino or piperidino. Generally increased stability and bathochromic shifts in dye hue are realized when at least one of the two pairs represented by R¹ and R⁴ or R² and R³ combine to complete a 5- or 6-membered ring. Rings which contain the amino nitrogen atom as the sole heteroatom are preferred, such as pyrrole, pyrrolene, indole, indolene, and piperidene.

In a specifically preferred form of the benzofuran nucleus both the R¹ and R⁴ and R² and R³ substituent together form a julolidine group. While the julolidine groups are illustrated below as unsubstituted groups, it is appreciated that substituents are possible. For example, one or two benzo rings can be readily fused with the julolidine ring.

The present dyes are made possible by the discovery of processes for preparing the 2-formyl 6-(tertiary amino)benzofuran intermediate. When R⁵ is hydrogen, the intermediates can be prepared by (1) condensation of a 2-hydroxybenzaldehyde having a nitrogen substituent in the 4-position with methyl bromoacetate and sodium hydride to produce the methyl ester of a 2-carboxybenzofuran, (2) reduction of the ester to the alcohol with lithium aluminum hydride, and (3) reoxidation of the alcohol to the aldehyde with manganese dioxide or p-chloranil.

The preparation is illustrated in the following reaction scheme:

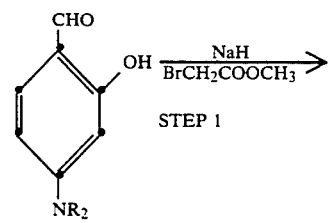

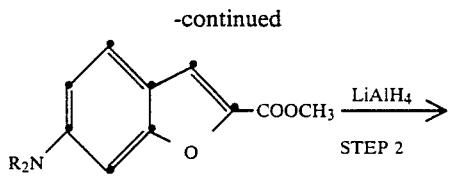

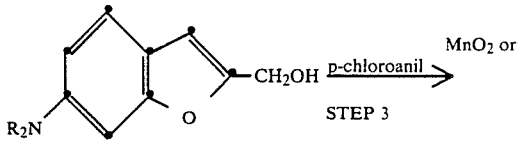

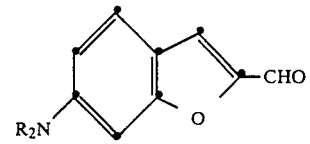

When R⁵ is other than hydrogen—e.g., alkyl or aryl, the intermediates can be prepared by (1) reacting o-aminophenol with R⁵ bromomethyl ketone in the presence of potassium carbonate, (2) employing zinc chloride to effect ring closure by the elimination water, and (3) achieving formyl substitution by the Vilsmeir reaction employing phosphoryl chloride and dimethylformamide (DMF).

The preparation is illustrated in the following reaction scheme:

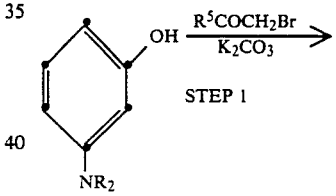

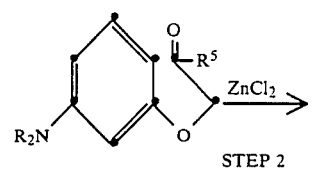

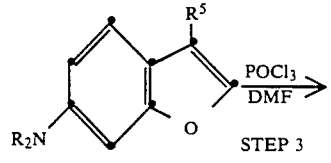

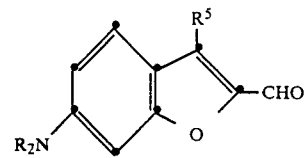

Although omitted for simplicity from the exemplary schematic reaction sequences, it is appreciated that in either synthetic approach R¹, R², R³, and R⁴ can be present and can take any of the forms described above.

Widely different choices of Z to complete the chromophore are possible, depending upon the application to be served. To illustrate the breadth of the invention, exemplary forms of Z are discussed by reference to two mutually exclusive classes of dyes: first to dyes which form highly efficient coinitiators for free radical polymerization and then to fluorescent dyes.

In one preferred form the dyes of the invention contain a coumarin nucleus. These dyes can be represented by the formula:

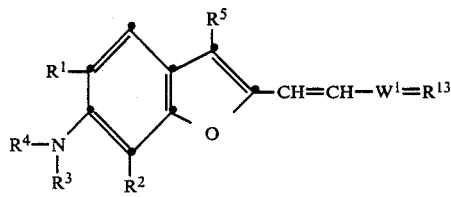
(V)

where
W¹ represents

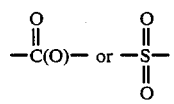

and
R¹³ represents a 3-coumarinyl group.

The coumarin nucleus can be selected from any of a variety of known forms, such as those disclosed in Specht et al U.S. Pat. No. 4,278,751 and published U.K. Spec. No. 2,083,832A, the disclosures of which are here incorporated by reference.

Preferred coumarin nuclei are those which are substituted in ring position 7 with an amino group, subsequently referred to as a 7-amino substituent. When the 7-amino substituent is a tertiary amine, it can form an extension of the dye chromophore in a manner similar to that described above in connection with 6-amino substituent of the benzofuranyl nucleus. Thus, the preferred 3-coumarinyl groups can be represented by the formula:

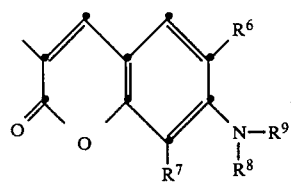
(VI)

where
Rhu and R⁷ each independently represent hydrogen, alkyl, or aryl;
R⁸ and R⁹ each independently represent alkyl; or
at least one of the substituent pairs represented by R⁶ and R⁹, R⁷ and R⁸, and R⁸ and R⁹ complete a 5- or 6-membered ring.

The preferences discussed above in connection with selections of R¹, R², R³, and R⁴ are applicable to selections of R⁶, R⁷, R⁸, and R⁹, respectively.

In another preferred form the dyes of the invention can take the form of bis[2-(6-amino)benzo furanyl] dyes in which the benzofuran nuclei share a common electron withdrawing moiety in the chromophore, such as W, described above. This again has the effect of lengthening and stabilizing the chromophore.

Exemplary bis[2-(6-amino)benzofuranyl] dyes useful as coinitiators for free radical polymerization and cross-linking are those represented by the formula:

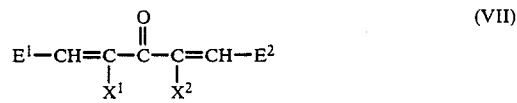
(VII)

where
E¹ and E² are independently 2-(6-amino)benzofuranyl groups and
X¹ and X² are independently hydrogen, alkyl, or aryl or together complete a 5 to 7 membered ring.

When X¹ and X² are independently selected, forms such as hydrogen, phenyl, methyl, or ethyl are preferred.

When X¹ and X² together complete a 5 to 7 membered ring, they preferably complete a ring satisfying the formulae:

(VIII)

or

(IX)

where
n is 2 to 4;
Y is —NR¹⁰— or —O—;
R¹⁰ is hydrogen, lower alkyl, or phenyl.

In the simplest form the ring can be a carbocyclic ring, such as cyclopentanone, cyclohexanone, or cycloheptanone. A functionally compatible heteroatom, such as nitrogen (e.g., —NR¹⁰—) or oxygen (i.e., —O—), can be substituted for one or more of the ring carbon atoms. Preferred heterocyclic rings for these bis[2-(6-amino)-benzofuranyl] dyes are those in which piperidin-4-one and tetrahydropyran-4-one rings form the central ring.

While dyes which contain a conjugated carbonyl or sulfonyl moiety acting as an electron acceptor for the chromophore form superior coinitiators for free radical polymerization, dyes which contain cyano (i.e., —CN) electron acceptors in the chromophore are generally recognized to form superior fluorescent dyes.

A very simple dye structure results when Z takes the form of a dicyanomethylene group. Preferred forms of such dyes are those which satisfy the formula:

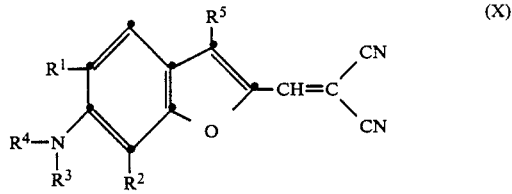
(X)

where R¹, R², R³, R⁴, and R⁵ preferably take the forms previously discussed.

Highly efficient fluorescent dyes are those which contain a dicyanomethylenepyran or dicyanomethylenethiopyran nucleus in the chromophore. Preferred dyes of this type can be represented by the formula:

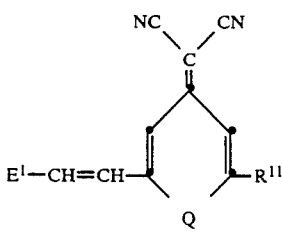

where
E¹ is a 2-(6-amino)benzofuranyl substituent;
Q is oxygen or sulfur; and
R¹¹ is alkyl, aryl, or —CH=CH—E¹.

When R¹¹ also includes E¹, it is apparent that these dyes can also be bis[2-(6-amino)benzofuranyl] dyes.

Although the above illustrative have been selected to illustrate the presence of a sulfonyl or carbonyl electron accepting moiety or a cyano electron accepting moiety in the dye chromophore, it is possible to produce dyes according to the invention which contain both types of electron accepting groups in the same chromophore. Such dyes are illustrated by reference to a preferred class of dyes according to the invention which include in addition to the basic 2-(6-amino)benzofuranyl nucleus a furan-2-one-5-ylidene nucleus. An example of such a nucleus containing both carbonyl and a cyano electron acceptor in the chromophore is represented by the following formula:

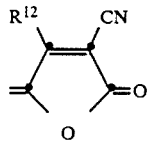

where R¹² is aryl, preferably phenyl.

There are, of course, numerous other potential acidic nuclei which can provide the electron acceptor portion of the dye chromophore. For example, the electron acceptor moiety W discussed above can take the form of an acidic nucleus of the type found in merocyanine dyes. In an illustrative form such dyes can be represented by the formula:

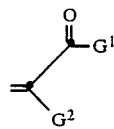

where
G¹ represents an alkyl group or substituted alkyl group, an aryl or substituted aryl group, an aralkyl group, an alkoxy group, an aryloxy group, a hydroxy group, an amino group, or a substituted amino group, wherein exemplary substituents can take the various forms noted in connection with Formulae 1 and 2;
G² can represent any one of the groups listed for G¹ and in addition can represent a cyano group, an alkyl, or arylsulfonyl group, or a group represented by

or G² taken together with G¹ can represent the elements needed to complete a cyclic acidic nucleus such as those derived from 2,4-oxazolidinone (e.g , 3-ethyl-2,4-oxazolidindione), 2,4-thiazolidindione (e.g., 3-methyl 2,4-thiazolidindione), 2-thio-2,4-oxazolidindione (e.g., 3-phenyl-2-thio-2,4-oxazolidindione), rhodanine, such as 3-ethylrhodanine, 3-phenylrhodanine, 3-(3-dimethylaminopropyl)rhodanine, and 3-carboxymethylrhodanine, hydantoin (e.g., 1,3-diethylhydantoin and 3-ethyl- 1-phenylhydantoin), 2-thiohydantoin (e.g., 1-ethyl-3-phenyl-2-thiohydantoin, 3-heptyl-1-phenyl-2-thiohydantoin, and arylsulfonyl-2-thiohydantoin), 2-pyrazolin-one, such as 3-methyl-1-phenyl-2-pyrazolin-5-one, 3-methyl-1-(4-carboxybutyl)-2-pyrazolin-5-one, and 3-methyl-2-(4-sulfophenyl)-2-pyrazolin-5-one, 2-isoxazolin-5-one (e.g., 3-phenyl-2-isoxazolin-5-one), 3,5-pyrazolidindione (e.g., 1-3,5-pyrazolidindione and 1,2-diphenyl-3,5-pyrazolidindione), 1,3-indandione, 1,3-dioxane-4,6-dione, 1,3-cyclohexanedione, barbituric acid (e.g., 1-ethylbarbituric acid and 1,3-diethylbarbituric acid), and 2-thiobarbituric acid (e.g., 1,3-diethyl-2-thiobarbituric acid and 1,3-bis(2-methoxyethyl)-2-thiobarbituric acid).

EXAMPLES

The invention can be better appreciated by reference to the following specific examples.

EXAMPLE 1

Preparation of 9-Formyl-2,3,6,7-tetrahydro-1H,5H benzo[i,j]furano[3,2-g]quinolizine

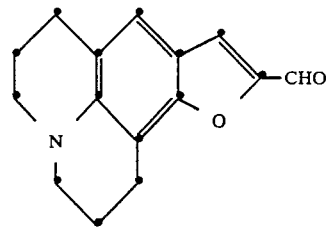

Step 1

Preparation of Methyl 2,3,6,7-Tetrahydro-1H,5H-benzo[i,j]furano[3,2-g]quinolizin-9-carboxylate To a 250 mL three necked round bottom flask equipped with a mechanical stirrer, reflux condenser, and Y-tube with nitrogen inlet and rubber septum was added 1.8 gm (45 mmol) of 60% NaH in mineral oil. After washing twice with reagent hexanes, 150 mL of distilled tetrahydrofuran (THF) was added to the flask, followed by the rapid addition, with vigorous stirring, of 4.34 gm (20 mmol) of 9-formyl-8-hydroxyjulolidine in 50 mL of THF. The flask was then placed in an 80° C. oil bath and stirred for several minutes. To the suspension was added in one portion 2.08 mL (22 mmol) of methyl bromoacetate. Sodium bromide precipitated from solution and vigorous stirring had to be maintained. The mixture was refluxed for 8 hours, allowed to cool to room temperature and diluted with 50 mL of diethyl ether.

The reaction was quenched by slow addition of 50 mL of dilute NH₄Cl solution. The phases were separated and the aqueous phase extracted with 50 mL of Et₂O. The combined organic phases were washed with 25 mL of 1 N NaOH. After washing with water and drying (MgSO4), the solvent was removed by rotary evaporation to yield as a yellow oil. The residue was purified by flash chromatography (CH2Cl2, SiO2, 1½×10″) to yield 3.03 gm (56%) of the product as a colorless oil: Field desorption mass spectrum: m/e 271 (M+). $^1$H 270 NMR (CDCl3): δ 1.98 (m, 4H, CH2CH2CH2), 2.90 (t, 4H, ArCH2), 3.21 (q, 4H, NCH2), 3,87 (s, 3H, OCH3), 7.02 (s, 1H, C=CHAr), 7.29 (s, 1H, ArH).

Step 2

Preparation of 9-Hydroxymethyl-2,3,6,7-tetrahydro-1H,5H-benzo[i,j]furano[3,2-g]quinolizine To a rapidly stirring suspension of 0.21 gm (5.5 mmol) of lithium tetrahydridoaluminate in 50 mL of distilled THF was added dropwise over 10 minutes 3.03 gm (11 mmol) of the compound of Step 1 in 25 mL of distilled THF After stirring for 90 minutes at room temperature, 5 mL of ethyl acetate was added dropwise, followed by the addition of 50 mL of water. The phases were separated. The aqueous phase, which contained the insoluble aluminum salts, was extracted with 50 mL of Et2O and the combined organic phases were washed with 20 mL saturated NaCl solution. After drying (MgSO4), the solvent was removed by rotary evaporation to yield 2.4 gm (89%) of the product as a colorless oil: Field desorption mass spectrum: m/e 245 (M+). $^1$H 270 NMR (CDCl3): δ 1.7 (s, 1H, OH), 4.66 (s, broad, 2H, CH2OH), 6.43 (s, 1H, C=CHAr), 7.24 (s, 1H, ArH).

Step 3

Preparation of 9-Formyl-2,3,6,7-tetrahydro-1H,5H-benzo[i,j]furano[3,2-g]quinolizine of Step 1

The compound from step 2 [2.4 gm (10 mmol)] was dissolved in 50 mL of chloroform and placed in a 200 mL three necked round bottom flask equipped with a heavy solvent water separator, reflux condenser apparatus, a glass stopcock, and mechanical stirrer. 1.7 gm (20 mmol) of active manganese dioxide was added and the suspension refluxed for 1 hour. The heat was removed and an additional 1.7 gm of MnO2 was added. This sequence of MnO2 addition and hour-long refluxing was continued until the reaction was complete by monitoring with thin layer chromatography (3:1 hexanes/EtOAc). The reaction was complete after 5 hours, during which time 8.5 gm (100 mmol, 10 equivalents) of additional manganese dioxide had been added. The product was isolated as follows: A ¼ inch layer of silica gel was placed in a 60 mL course sintered glass funnel and placed on a 500 mL vacuum flask. The chloroform suspension was poured through the silica gel under vacuum and the silica gel was washed with 300 mL of dichloromethane. The solvent was removed by rotary evaporation and the resulting residue recrystallized from 40 mL of ethyl acetate to yield 1.48 gm (62%) of the desired product as yellow flakes: Field desorption mass spectrum: m/e 241 (M+); m.p. 140°–141° C. Anal. calcd. for C15H15NO2: C, 74.7; H, 6.3; N, 5.8. Found: C, 74.7; H, 6 3; N, 5.8. $^1$H 270 NMR (CDCl3): δ 7.08 (s, 1H, C=CHAr), 7.33 (s, 1H, ArH), 9.53 (s, 1H, CHO). An additional 220 mg was recovered in a second recrystallization from ethyl acetate for an overall yield of 69%.

EXAMPLE 2

Preparation of 6-(N,N-Diethylamino)-2 formylbenzo[b]furan

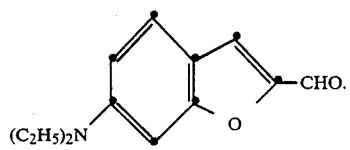

Step 1

Preparation of Methyl 6-(N,N-diethylamino)-2-benzo[b]furanylcarboxylate

To a 250 mL three necked, round bottom flask equipped with a mechanical stirrer, reflux condenser, and Y-tube with a rubber septum and nitrogen inlet was added 1.8 gm (45 mmol) of 60% sodium hydride in mineral oil. After washing twice with 20 mL of hexanes, 150 mL of THF was added, followed by the rapid dropwise addition via transfer syringe of 3.86 gm (20 mmol) of 4-(N,N diethylamino)-2-hydroxybenzaldehyde, dissolved in 50 mL of tetrahydrofuran (THF). The flask was placed in an 80° C. oil bath and stirred vigorously for 5 minutes, at which time 2.08 mL (20 mmol) of methyl bromoacetate was added in one portion. Sodium bromide precipitated from solution and vigorous stirring had to be maintained throughout. The suspension was refluxed for 80 minutes, allowed to cool to room temperature, and diluted with 75 mL of diethyl ether. The reaction was quenched by the slow dropwise addition of 50 mL of dilute aqueous ammonium chloride. The phases were separated and the aqueous phase extracted with 100 mL of diethyl ether (Et2O). The combined organic phases were washed with 20 mL 1N NaOH and 20 mL water. After drying (MgSO4), the solvent was removed by rotary evaporation and the residual oil purified by flash chromatography (CH2Cl2; SiO2, 1½×15″) to yield 2.23 gm (45.3%) of the product as a colorless oil. Field desorption mass spectrum: m/e 247 (M+). Anal. calcd. for C14H17NO3: C, 68.0., H, 6.9; N, 5.7. Found: C, 67.9; H, 6.8; N, 5.8. $^1$H 270 NMR (CDCl3): δ 6.7 (m, 2H, ArH$_{a,b}$), 7.4 (m, 2H, ArH$_{c,d}$).

Step 2

Preparation of 6-(N,N-diethylamino)-2-hydroxymethylbenzo[b]furan

To a rapidly stirring suspension of lithium tetrahydridoaluminate in 100 mL of THF was added dropwise over 10 minutes 12.4 gm (50 mmol) of Step 1 of this example compound dissolved in 50 mL of ethyl acetate was added dropwise and the resulting mixture was stirred for 10 minutes. The solution was diluted with 75 mL of Et2O and 50 mL of water. The phases were separated, and the aqueous phase, which contained the insoluble aluminum salts, was extracted with 50 mL of Et2O. The combined organic phases were washed with 50 mL saturated NaCl solution, dried (MgSO4), and the solvent removed by rotary evaporation to yield 9.0 gm (82%) of 4b as a pale yellow oil. Purification of an analytical sample by flash chromatography (CH2Cl2; SiO2, 1×10″) yielded the product as a colorless oil. Field desorption mass spectrum: m/e 219 (M+). Anal. calcd. for C13H17NO2: C, 71.2; H, 7.8., N, 6.4. Found: C, 70.8; H, 7.6; N, 6.1. $^1$H 270 NMR (CDCl3): δ 2.2 (s, 1H, OH), 4.62 (s, 2H, CH$_2$OH), 6.45 (d, 1H, ArH), 6.66 (dd, 1H, ArH), 6.74 (d, 1H, ArH), 7.28 (d, 1H, ArH).

Step 3

Preparation of 6-(N,N-Diethylamino)-2-formylbenzo[b]furan

To a 50 mL round bottomed flask equipped with a magnetic stirrer and reflux condenser was added 21.9 gm (0.1 mol) of the compound of Step 2 of this example, 500 mL of dry carbon tetrachloride, and 27.0 gm (0.11 mol) of p-chloranil. After refluxing for 90 minutes, the suspension was diluted with 200 mL of dichloromethane. After filtration, the solution was washed twice with 100 mL 1N NaOH. The organic phase was dried (MgSO$_4$), the solvent removed by rotary evaporation and the residue purified by flash chromatography (6:1 hexanes/EtOAc; SiO$_2$, 2×18") to yield 15.0 gm (69%) of the product as a yellow oil. Field desorption mass spectrum: m/e 217 s (M$^+$) Anal. calcd. for C$_{13}$H$_{15}$NO$_2$: C, 71.9; H, 7.0; N, 6.45. Found: C, 71.8; H, 7.0; N, 6.3. $^1$H 270 NMR (CDCl$_3$): δ 6.69 (d, 1H), 6.74 (dd, 1H), 7.37 (d, 1H), 7.46 (d, 1H), 9.58 (s, 1H).

The new dyes of this invention are prepared by condensation of the new intermediates of Examples 1 and 2 in pyridine with an active methylene compound such as 3-cyano-4-phenyl-2-furanone, cyclopentanone, 4-dicyanomethylene-2,6-dimethyl-4H-pyran, 3-acetyl-7-(N,N-dialkylamino)coumarins and the like.

The following examples illustrate the condensation of the intermediate with an active methylene compound to produce the dyes of the invention.

EXAMPLE 3

Preparation of 3-cyano-4-phenyl-5-(2,3,6,7-tetrahydro-1H,5H-benzo[i,j]furano[3,2-g]quinolizin-9-yl-methylene)-2-furanone, Dye 1, Table I To 3 mL of pyridine in a 10 mL round-bottomed flask was added 120 mg (0.5 mmol) of the compound of Example 1 and 80 mg (0.5 mmol) of 3-cyano-4-phenyl-2-furanone. The solution was heated at 80° C. for 3 hours, cooled and poured into 20 mL dilute NH$_4$Cl. The resulting mixture was extracted 2× with 20 mL 3:2 hexanes/Et$_2$O and the combined organic extracts washed once with 10 mL of water. The organic phase was dried (MgSO$_4$) and the solvent removed by rotary evaporation. The resulting solid was purified by flash chromatography (7:2 cyclohexane/EtOAc; Si$_2$, 1×12") to yield 40 mg (22%) of Compound 6, Table I. Field desorption mass spectrum: m/e 408 (M$^+$); m.p. 231°-32° C. Anal. calcd. for C$_{26}$H$_{20}$N$_2$O$_3$: C, 76.4; H, 4.9; N, 6 9. Found: C, 76.1; H, 4.7; N, 6.8.

EXAMPLE 4

Preparation of 3 Cyano 5 [6 (N,N diethtylamino) benzo[b]furanvlmethylene]-4 phenyl 2 furanone. Dye 2, Table I To 5 mL of pyridine in a 15 mL round-bottom flask was added 217 mg (1 mmol) of the compound of Example 2 and 172 mg (1 mmol) of 3-cyano-4-phenyl-2-furanone. The solution was heated at 80° C. for one hour, cooled and poured into 20 mL dilute NH$_4$Cl. The resulting mixture was extracted 2× with 20 mL 3:2 hexanes Et$_2$O and the combined organic extracts were washed once with 10 mL of water, The organic phase was dried (MgSO$_4$) and the solvent removed by rotary evaporation. The resulting solid was purified by flash chromatography (7:2 cyclohexane/EtOAc; SiO$_2$, 1×12") to yield 292 mg of dye. Anal. calcd for C$_{24}$H$_{20}$N$_2$O$_3$: C, 74.2; H, 5.4; N, 7.5. Found: C, 74.0, H, 5.2., N, 6.9.

EXAMPLE 5

Preparation of 7 N,N Diethylamino-3 {3 [6 (N,N diethylamino)benzo[b]furanyl]acryloyl}coumarin, Dye 3, Table I To 25 mL of absolute ethanol in a 50 mL round-bottomed flask was added 217 mg (1 mmol) of 6 (N,N diethylamino) 2 formylbenzo[b]furan and 259 mg (lmmol) of 3 acetyl 7 (N,N diethylamino)coumarin. After refluxing for several minutes to dissolve the solids, 100 mg of piperidine was added and reflux was continued for one hour. The solution was allowed to cool to room temperature and then placed in a freezer overnight. The solid was filtered and recrystallized from 50 mL of ethanol to yield the product as deep red needles. Field desorption was spectrum: m/e 458 (M$^+$); m.p. 169°-171° C.

EXAMPLE 6

Preparation of 9 [3-(2,3,6,7 Tetrahydro -1H,5H benzo[i,j]furano[3,2g]-quinolizin-9-yl)acryloyl]-1,2,4,5-tetrahydro-3H,6H,1OH[1]benzopyrano-[9,9a,1 gh]quinolazin-10-one, Dye 4, Table I To 25 mL of absolute ethanol in a 50 mL round-bottomed flask was added 241 mg (lmmol) of the compound of Example 3 and 283 mg (1 mmol) of 3 acetyl 7 (N,N diethylamino)coumarin. After refluxing for several minutes to dissolve the solids, 100 mg of piperidine was added and reflux was continued for two hours. The solution was allowed to cool and the solid filtered to yield 450 mg (89%) of product as black needles. Field desorption mass spectrum: m/e 506 (M$^+$); m.p. 242°-244° C.

EXAMPLE 7

Preparation of 4 (Dicyanomethylene)-2-methyl-6 [2 (N,N diethylamino)benzo[1]-furanyl]ethenyl 4H pyran, Dye 5, Table I To 10 mL of toluene in a 25 mL round-bottom flask was added 217 mg (1 mmol) of the aldehyde of Example 2, 172 mg (1 mmol) of 4 -(dicyanomethylene)-2,6 dimethyl 4H-pyran, 85 mg of piperdine, and 60 mg of glacial acetic acid. The solution was refluxed for 30 minutes and another 85 mg of piperidine and 60 mg of acetic acid were added. After refluxing for an additional 30 minutes, the reaction mixture was cooled, diluted with 50 mL Et$_2$O, and washed with 10 mL saturated NaHCO$_3$ followed by 10 mL of water. The organic phase was dried (MgSO$_4$) and the solvent removed by rotary evaporation to yield 0.39 g of a purple solid. Flash chromatography (7:2 cyclohexane/EtOAc; SiO$_2$, 1×12") yielded 160 mg (43%) of Dye 5 as a brown solid: Field desorption mass spectrum: m/e 371 (M$^+$); m.p. 218°-220° C. Anal calc'd. for C$_{23}$H$_{21}$N$_3$O$_2$: C, 74; H, 5.9; N, 9.8. Found: C, 74.0; H, 5 7; N, 10.3.

EXAMPLE 8

Preparation of 4 (Dicyanomethylene) 2-methyl-6-[2 -(2,3,6,7-tetrahydro) -1H,5H -benzo[i,j]furano[3.2 glquinolizin-9-yl]ethenyl-4-H nyran, Dye 6. Table I To 5 mL of toluene in a 15 mL round bottom flask was added 100 mg of (0.4 mmol) of the aldehyde of Example 1, 78 mg (0.45 mmol) of 4-(dicyanomethylene)- 2,6-dimethyl-4H-pyran, 20 mg of piperdine, and 20 mg of glacial acetic acid. The solution was refluxed for 3 hours, cooled, and poured through a 0.64 cm pad of silica gel into a vacuum flask. The silica gel was washed with dichloromethane until all color was removed. The solvent was removed by rotary evaporation and the residue was purified by flash chromatography (7:2 cyclohexane/EtOAc; $SiO_2$, 1×12") to yield 40 mg of (25%) of Dye 6 as a deep red solid: Field description mass spectrum: m/e 395 (M+)., m.p. 247°–249° C. Anal. calc'd. for $C_{25}H_{21}N_3O_2$: C, 75.6; H, 5.3; N, 10.5. Found: C, 75.3; H, 5.2; N, 10.3.

EXAMPLE 9

Preparation of 2.5-Bis[6 (N,N-diethylamino) benzo[b]-2-furanylmethylene]-cyclopentanone, Dye 7, Table I A solution of 370 mg (1.7 mmol) of the aldehyde of Example 2 and 72 mg (0.085 mmol) of cyclopentanone in 15 mL of 2N methanolic KOH was refluxed for 1½ hours. The solution was cooled to room temperature and the product was filtered, washed with MeOH (yield 290 mg, 72%) and recrystallized from a cyclohexane/toluene mixture. The compound is solvatochromic with an absorption maximum of 565 nm in methanol.

EXAMPLE 10

Preparation of 2.5-Bis(2,3,6,7-tetrahydro -1H,5H benzo[i,j]furano[3,2g]-quinolizin-9-yl -methylene)cyclopentanone, Dye 8, Table I This compound was prepared as described for Example 7 except using the intermediate of Example 1. It has an absorption maximum of 590 nm in methanol.

EXAMPLE 11

Preparation of 8-(p-methoxyphenacyloxy)julolidine

A mixture of 4.65 g (0.025M) of 8-hydroxy julolidine, 5.50 g (0.024M) of p-(methoxy)phenacyl bromide and 3.45 g (1 equiv.) of potassium carbonate in 30 mL of acetone and 15 drops of water was refluxed overnight. The reaction mixture was poured in water and extracted with ether. The ether extract was dried ($MgSO_4$), rotary evaporated and the residue was Purified by flash chromatography to give 5.82 g (72%) of product: F.D. m/e 337 (M+); Anal. Calc'd for $C_{21}H_{23}NO_3$: C, 74.8., H, 6.9; N, 4 2. Found: C, 73 9; H, 6.8; N, 4 0.

EXAMPLE 12

Penetration of 8-(p-methoxyphenyl)-2,3,6,7-tetrahydro-1H,5H benzo[i,j]furano[3.2-g]quinolizine A mixture of 5.52 g (0.0164M) of 8-(p-methoxyphenacyloxy)Julolidine and 1.36 g (0.01M) of zinc chloride in 10 mL of ethanol was refluxed for 4 hours. The reaction mixture was poured into dilute HCl and extracted with methylene chloride. The extracts were washed with water, dried ($MgSO_4$), rotary evaporated. The residue was recrystallized from hexanes and a small amount of ethyl acetate to give 2.85 g (55%) of product: F.D. m/e 319 (M+); Anal Calc'd. for $C_{21}H_{21}NO_2$: C, 79.0; H, 6.6; N, 4.4. Found: C, 78.0, H, 6.6; N, 4.2.

EXAMPLE 13

Prepatration of 9-Formyl-8-(p-methoxyphenyl)-2,3,6,7-tetrahydro-1H,5H benzo[i,j]furano[3.2-g]quinolizine A Vilsmeir reagent was prepared by mixing 0.223 g (1.5 mmol) of phosphoryl chloride and 1 mL of DMF and stirring at room temperature for 1 hour. To the Vilsmeir reagent was added 0.32 g (1 mmol) of the Product from Example 12. The reaction mixture was heated at 50° C. for 10 minutes, poured into aqueous sodium acetate, and extracted with methylene chloride. The extracts were dried ($MgSO_4$), rotary evaporated and flash chromatographed to give 268 mg (77%) of product: F.D. m/e 347 (M+); Anal. Calc'd. for $C_{22}H_{21}NO_3$: C, 76.1; H, 6.1., N, 4.0. Found: C, 75.7; H, 5.7; N, 3.7.

EXAMPLE 14

Preparation of 3-Cyano-4-phenyl -5-[8-(p-methoxyphenyl)-2,3,6,7-tetrahydro-1H,5H benzo[i,j]furano3,2-g]quinolizin-9-yl methylene]2 furanone, Dye 10, Table I A mixture of 52 mg (0.15 mmol) of the aldehyde from Example 13 and 27 mg (1 equiv.) of 3-cyano-4-phenyl-2-furanone in 0.7 mL of pyridine was heated at 90° C. for 2 hours. To the hot reaction mixture were added 12 mL of acetonitrile, and the mixture was brought to reflux for 5 minutes. Dye 10 crystallized on cooling to give 50 mg (67%) of crystals: F.D. m/e 514 (M+); Anal. Calc'd. for $C_{33}H_{26}N_2O_4$: C, 77.0; H, 5.1, N, 5.4. Found: C, 75.9; H, 5.1; N, 5.4.

In Table I are listed representative dyes according to the invention and the effectiveness of the 6-tertiary aminobenzofuran nucleus in bathochromically shifting the maximum absorption wavelength of the dyes of this invention is illustrated by comparing the maximum absorptions of these dyes with dyes :containing structurally similar nuclei.

TABLE I

Structure: C₆H₅ and CN substituents on a ring with O, attached to =CH-D¹

| D¹ | Compound | nm (CH$_2$Cl$_2$) | ε(10³) |
|---|---|---|---|
| (julolidine-benzofuran fused structure) | Dye 1 | 655 | 52 |
| (Et₂N-benzofuran structure) | Dye 2 | 613 | 33 |
| (Et₂N-phenyl) | Control | 537 | 50 |
| (Me₂N-styryl) | Control | 565 | 44 |

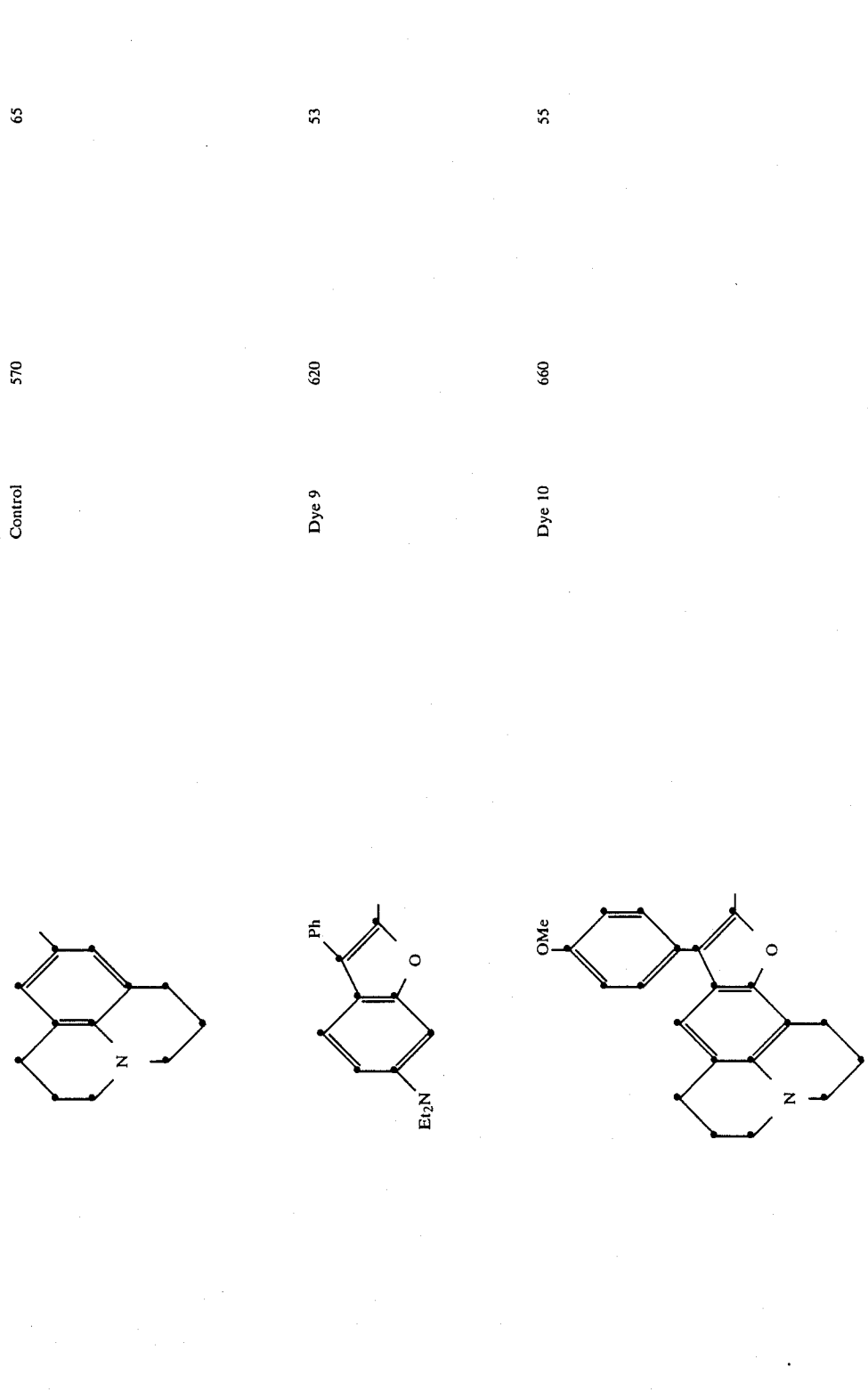

TABLE I-continued

| | Dye 11 | 696 | 49 |
|---|---|---|---|

(Structure: OMe-phenyl with vinyl group, fused to ring system with julolidine-like N)

| Compound | λ-max nm (CH₂Cl₂) | ε(10³) |
|---|---|---|
| Control | 415 | 38 |
| control | 430 | 38 |
| Dye 3 | 445 495 (C₆H₆) | 31 50 |

Complete Dye Structure (shown for each compound):
- Control: bis(dialkylamino)chalcone-type structure with NEt₂ and Me₂N groups
- control: similar structure with NEt₂ group
- Dye 3: extended dienone structure with NEt₂ and Et₂N groups TABLE I-continued

| Structure | Dye | λ | % |
|---|---|---|---|
| (structure) | Dye 4 | 461<br>511 (C₆H₆) | 32<br>52 |
| (structure) | Dye 5 | 517 | 48 |
| (structure) | Dye 6 | 540 | 38 |
| (structure) | Dye 7 | 513 (Cyclohexane)<br>632 (Toluene)<br>538 (Acetonitrile)<br>565 (Methanol) | 89<br>67<br>59<br>54 |

TABLE I-continued
| | | |
|---|---|---|
| | Dye 8 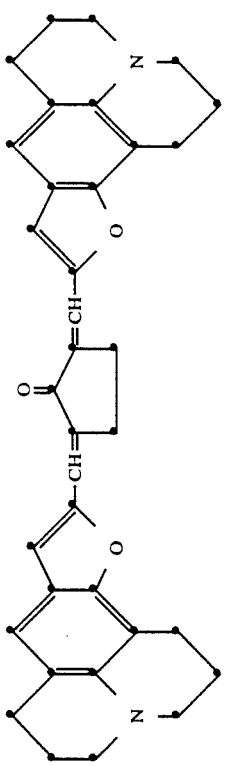 | 530 (Cyclohexane)<br>542 (Ethyl acetate)<br>590 (Methanol) |

The utility of the dyes of the invention as free radical polymerization coinitators can be appreciated by reference to Specht et al U.S. Pat. Nos. 4,289,844 and 4,278,751 and published U.K. Spec. 2,083,832A; Guild U.S. Pat. No. 4,247,623; and Klein et al U.S. Ser. No. 77,714, filed July 24, 1987, now U.S. Pat. 4,792,517. The dyes having fluorescent properties can be substituted for conventional dyes One preferred application for the fluorescent dyes is in organic electroluminescent cells. The fluorescent dyes of this invention can be substituted for any of those disclosed for use in organic electroluminescent cells by Tang U.S. Ser. No. 20,408, filed Mar. 2, 1987, now abandoned in favor of U.S. Ser. No. 108,342, filed Oct. 14, 1987, which has issued as U.S. Pat. No. 4,769,292.

The invention has been described in detail with particular reference to preferred embodiments thereof, but it will be understood that variations and modifications can be effected within the spirit and scope of the invention.

What is claimed is:

1. A dye which satisfies the formula:

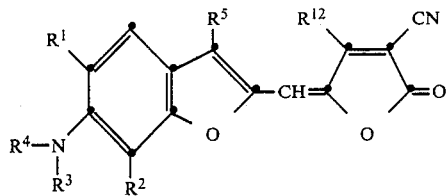

wherein
$R^1$, $R^2$, $R^3$, and $R^4$ together complete a julolidene ring;
$R^5$ is hydrogen, methyl, ethyl, propyl, or phenyl; and
$R^{12}$ is phenyl.

2. 3-Cyano-4-phenyl-5-(2,3,6,7-tetrahydro-1H,5H-benzo[i,j]furano[3,2-g]quinolizin-9-yl-methylene) -2-furanone.

3. 3-Cyano-4-phenyl-5-[8-(p-methoxyphenyl)2,3,6,7-tetrahydro -1H,5H-benzo[i,j]furano[3,2-g]quinolizin-9-yl -methylene]2-furanone.

4. 3-Cyano-4-phenyl-5-(8-phenyl2,3,6,7-tetrahydro-1H,5H-benzo[i,j]furano[3,2-g]quinolizin-9-yl-methylene)-2-furanone.

5. 3-Cyano-4-phenyl-5-{3-[8-(p-methoxyphenyl)2,3,6,7-tetrahydro1 H,5H-benzo[i,j]furano[3,2-g]-quinolizin-9-yl]-2-propenylidene}-2-furanone.

* * * * *